United States Patent
Babazadeh et al.

(10) Patent No.: US 9,285,399 B2
(45) Date of Patent: Mar. 15, 2016

(54) SWITCHING REGULATOR CYCLE-BY-CYCLE CURRENT ESTIMATION

(75) Inventors: Amir Babazadeh, Irvine, CA (US); Benjamim Tang, Rancho Palos Verdes, CA (US); Giuseppe Bernacchia, Redondo Beach, CA (US)

(73) Assignee: Infineon Technologies Austria AG, Villach (AT)

(*) Notice: Subject to any disclaimer, the term of this patent is extended or adjusted under 35 U.S.C. 154(b) by 578 days.

(21) Appl. No.: 13/537,827

(22) Filed: Jun. 29, 2012

(65) Prior Publication Data
US 2014/0002037 A1   Jan. 2, 2014

(51) Int. Cl.
*G05F 1/10* (2006.01)
*G01R 19/00* (2006.01)
*H02M 3/156* (2006.01)
*H02M 3/158* (2006.01)
*H02M 1/00* (2007.01)

(52) U.S. Cl.
CPC ............ *G01R 19/0092* (2013.01); *H02M 3/156* (2013.01); *H02M 3/1584* (2013.01); *H02M 2001/0009* (2013.01); *H02M 2003/1566* (2013.01)

(58) Field of Classification Search
CPC ............. G01R 19/0092; H02M 2001/0009; H02M 2003/1566; H02M 3/156; H02M 3/1584; G05F 1/1565
USPC ......... 323/207, 222, 224, 271, 282–289, 311, 323/312; 363/16, 17, 21.04, 49, 56.01, 65, 363/72, 132
See application file for complete search history.

(56) References Cited

U.S. PATENT DOCUMENTS

| | | | | |
|---|---|---|---|---|
| 6,262,565 | B1 * | 7/2001 | Williams | H02M 5/257 323/237 |
| 6,850,045 | B2 * | 2/2005 | Muratov | H02M 3/1584 323/240 |
| 6,894,464 | B2 * | 5/2005 | Zhang | 323/268 |

(Continued)

FOREIGN PATENT DOCUMENTS

| CN | 102447377 A | 5/2012 |
|---|---|---|
| TW | 201205263 A | 2/2012 |

OTHER PUBLICATIONS

Qiu, et al. "Digital Average Current-Mode Control Using Current Estimation and Capacitor Charge Balance Principle for DC-DC Converters Operating in DCM." IEEE Transactions on Power Electronics, vol. 25, No. 26. pp. 1537-1545. IEEE, Jun. 2010.

*Primary Examiner* — Rajnikant Patel
(74) *Attorney, Agent, or Firm* — Murphy, Bilak & Homiller, PLLC (57) ABSTRACT

A switching regulator includes an output phase having a high-side transistor and a low-side transistor operable to switch on and off at different periods responsive to a pulse width modulation (PWM) signal applied to the output phase, each cycle of the PWM signal having an on-portion and an off-portion. The switching regulator further includes a current sense circuit operable to sense the current of the low-side transistor, an analog-to-digital converter operable to sample the sensed low-side transistor current during the off-portion for each PWM cycle and a current estimator operable to estimate a cycle average current for the present PWM cycle based on the low-side transistor current sampled during the off-portion for the immediately preceding PWM cycle and a pulse width estimate for the on-portion for the present PWM cycle.

15 Claims, 6 Drawing Sheets

(56) References Cited

U.S. PATENT DOCUMENTS

| | | | |
|---|---|---|---|
| 7,148,669 B2 * | 12/2006 | Maksimovic et al. | 323/283 |
| 7,852,053 B2 * | 12/2010 | Martin et al. | 323/272 |
| 7,902,803 B2 * | 3/2011 | Peng et al. | 323/283 |
| 8,049,476 B2 * | 11/2011 | Schiff | H02M 3/1584 323/282 |
| 8,344,709 B2 * | 1/2013 | Zhang | G05F 1/565 323/222 |
| 8,450,989 B2 * | 5/2013 | Wiktor | 323/283 |
| 8,536,842 B2 * | 9/2013 | Prodi et al. | 323/272 |
| 8,598,856 B1 * | 12/2013 | Carroll | H02M 3/1588 323/222 |
| 2007/0069677 A1 * | 3/2007 | MacKay | 318/439 |
| 2008/0084721 A1 | 4/2008 | Miramonti et al. | |
| 2010/0188062 A1 | 7/2010 | Candage et al. | |
| 2011/0119513 A1 | 5/2011 | Krishnamurthy et al. | |
| 2012/0019226 A1 | 1/2012 | Wiktor | |

* cited by examiner

SWITCHING REGULATOR CYCLE-BY-CYCLE CURRENT ESTIMATION

FIELD OF TECHNOLOGY

The present application relates to switching regulators, in particular cycle-by-cycle current estimation for switching regulators.

BACKGROUND

Electronic equipment such as microprocessors, graphics processors, network processors, digital signal processors, etc. must often respond very fast to large step-type load transients. Switching power converters preferably have a voltage response that follows the ideal target voltage closely while reducing ring back. A system with such a transient response often behaves well over a wide frequency range of load changes. Some conventional switching regulators typically employ either a very high number of current samples per cycle or one current sample per cycle to understand the current conditions at the output of the regulator. In the case of multiple current samples per cycle, high quality ADCs (analog-to-digital converters) are needed to acquire the sample which significantly increases the system cost, increases power consumption and requires more area on the chip. On the other hand, only a single current sample per cycle introduces a significant latency into the current loop and results in poor transient response of the switching regulator. Other conventional switching regulators provide adaptive voltage positioning (AVP) to minimize the voltage excursion during high frequency repetitive load changes, i.e. to minimize the output impedance. Typically the voltage is sampled at a high rate, but the inductor current is sampled at a much lower rate. At load changes, the AVP loop introduces a high latency into the control system and causes ring back and unfavorable voltage response or output impedance peaking because of the low inductor current sampling rate.

SUMMARY

According to an embodiment of a method of estimating the cycle average current for an output phase of a switching regulator during pulse width modulation (PWM) cycles of the switching regulator, each PWM cycle having an on-portion and an off-portion, the method comprises: measuring a low-side transistor current of the output phase during the off-portion for each PWM cycle; estimating a cycle average current for the present PWM cycle based on the low-side transistor current measured during the off-portion for the immediately preceding PWM cycle and a pulse width estimate for the on-portion for the present PWM cycle; and incorporating the cycle average current estimate into a response of the switching regulator.

According to an embodiment of a switching regulator, the switching regulator comprises an output phase including a high-side transistor and a low-side transistor operable to switch on and off at different periods responsive to a pulse width modulation (PWM) signal applied to the output phase, each cycle of the PWM signal having an on-portion and an off-portion. The switching regulator further comprises a current sense circuit operable to sense the current of the low-side transistor, an analog-to-digital converter operable to sample the sensed low-side transistor current during the off-portion for each PWM cycle and a current estimator operable to estimate a cycle average current for the present PWM cycle based on the low-side transistor current sampled during the off-portion for the immediately preceding PWM cycle and a pulse width estimate for the on-portion for the present PWM cycle.

According to an embodiment of a method of estimating average current for a plurality of output phases of a multi-phase switching regulator during pulse width modulation (PWM) cycles of the multi-phase switching regulator, each PWM cycle having an on-portion and an off-portion, the method comprises: measuring a low-side transistor current of each output phase during the off-portion for each PWM cycle; estimating an average current of each output phase for the present PWM cycle based on the low-side transistor current measured for each output phase during the off-portion for the immediately preceding PWM cycle and a pulse width estimate for the on-portion for the present PWM cycle; and combining the average current estimates for the plurality of output phases to generate a total average current estimate for the present PWM cycle.

According to an embodiment of a multi-phase switching regulator, the multi-phase switching regulator comprises a plurality of output phases each including a high-side transistor and a low-side transistor operable to switch on and off at different periods responsive to a pulse width modulation (PWM) signal, each cycle of the PWM signal having an on-portion and an off-portion. The multi-phase switching regulator further comprises a current sense circuit operable to sense the current of each low-side transistor, an analog-to-digital converter operable to sample the sensed low-side transistor current of each output phase during the off-portion for each PWM cycle and a current estimator operable to estimate an average current of each output phase for the present PWM cycle based on the low-side transistor current measured for each output phase during the off-portion for the immediately preceding PWM cycle and a pulse width estimate for the on-portion for the present PWM cycle, and combine the average current estimates for the plurality of output phases to generate a total average current estimate for the present PWM cycle.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide cycle-by-cycle current estimation for switching regulators based on measured current in the previous cycle and a pulse width estimate in the present cycle. The cycle-by-cycle current estimation techniques described herein can be applied to any switching regulator architecture, including: buck; boost; buck-boost; flyback; push-pull; half-bridge; full-bridge; and SEPIC (single-ended primary-inductor converter). A buck converter reduces a DC voltage to a lower DC voltage. A boost converter provides an output voltage that is higher than the input. A buck-boost converter generates an output voltage opposite in polarity to the input. A flyback converter generates an output voltage that is less than or greater than the input, as well as multiple outputs. A push-pull converter is a two-transistor converter especially efficient at low input voltages. A half-bridge converter is a two-transistor converter used in many off-line applications. A full-bridge converter is a four-transistor converter usually used in off-line designs that can generate very high output power. A SEPIC is a type of DC-DC converter allowing the electrical voltage at its output to be greater than, less than, or equal to that at its input.

For each type of switching regulator architecture, a fast load transient response is realized by providing cycle-by-cycle current estimation. The current is estimated cycle-by-cycle based on the measured current in the previous cycle and a prediction of the pulse width of the present cycle.

Described next are embodiments of the cycle-by-cycle current estimation technique, explained in the context of a switched mode buck converter. Those skilled in the art will appreciate that the cycle-by-cycle current estimation embodiments described herein can be readily applied to other switching regulator architectures with minor modifications, if any. Such modifications are well within the capability of one of ordinary skill in the art, without requiring undue experimentation.

Figure 1:
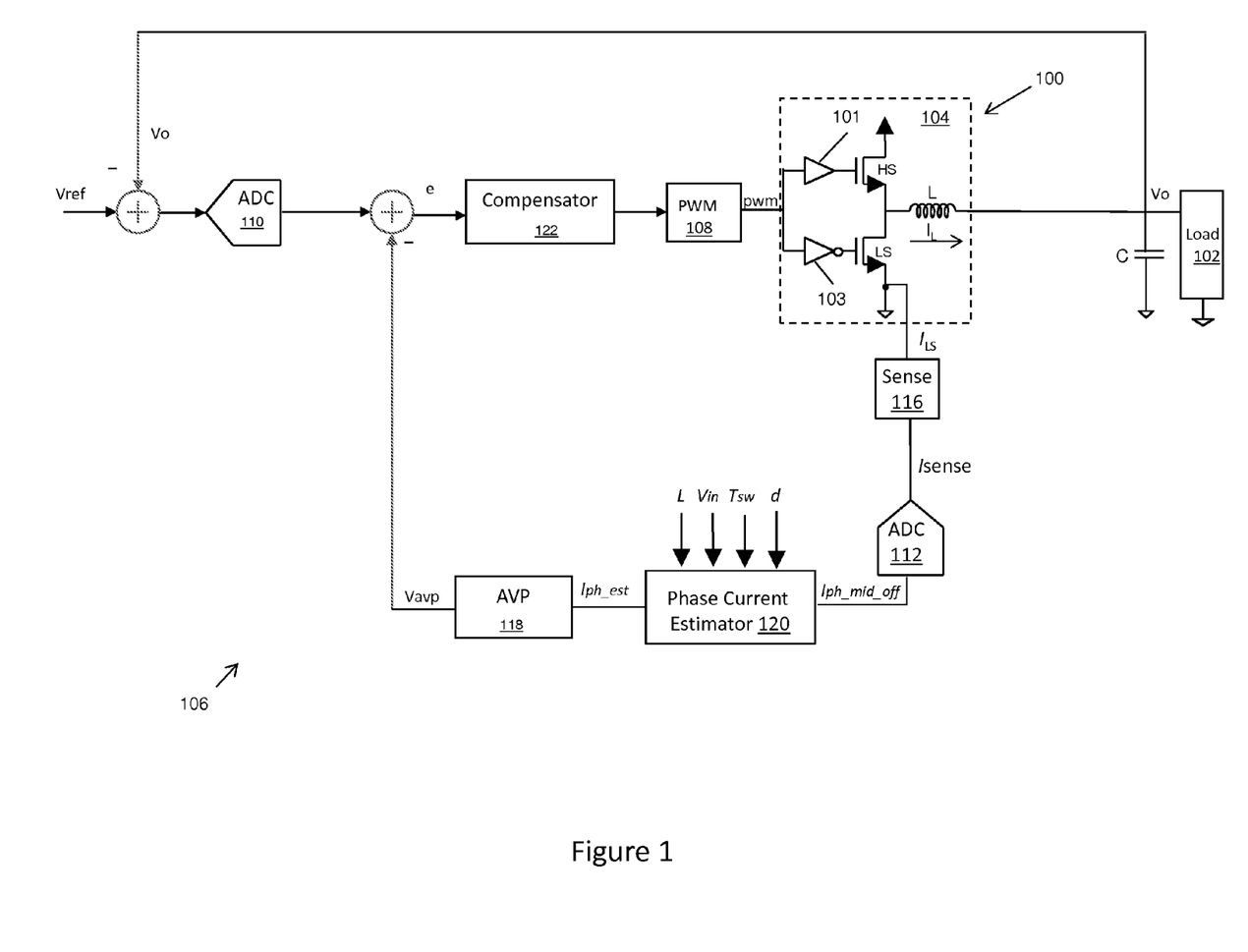
FIG. 1 illustrates a block diagram of an embodiment of a single-phase switching regulator which implements cycle-by-cycle current estimation.

FIG. 1 illustrates a block diagram of an embodiment of a switched mode buck converter which includes a power stage 100 coupled to a load 102 such as a microprocessor, graphics processor, network processor, digital signal processor, etc. The power stage 100 has a single phase 104 according to this embodiment i.e. the switched mode buck converter is a single-phase switching regulator where the load current is supplied by one phase. The phase 104 includes a high-side transistor (HS) and a low-side transistor (LS) driven by corresponding drivers 101, 103. The output phase 104 provides current to the load 102 through an inductor (L). The amount of current provided by the output phase 104 depends on the switch state of the high-side and low-side transistors. An output capacitor (C) is also coupled to the load 102, between the phase inductor and the load 102 as shown in FIG. 1. The output capacitor can be a single capacitor or a bank of capacitors in parallel.

Operation of the power stage 100 is controlled via a pulse width modulation (PWM) signal (pwm) generated by a controller 106. The controller 106 includes a PWM control unit 108 that generates the PWM signal. The PWM signal is applied to the output phase 104, and each cycle of the PWM signal has an on-portion and an off-portion. The high-side transistor of the output phase 104 is switched on during the on-portion of each PWM cycle and the low-side transistor is switched off. Conversely, the low-side transistor is switched on during the off-portion of each PWM cycle and the high-side transistor is switched off.

The duty cycle (d) of the PWM signal determines how long the high-side and low-side transistors are switched on during each PWM cycle, respectively, and therefore the amount of current sourced by the output phase 104 to the load 102. The PWM signal is generated based on the difference between a reference voltage (Vref) provided to the switched mode buck converter and the load voltage (Vo). In some embodiments, the reference voltage corresponds to a voltage identification (VID) associated with the load 102. The VID determines the regulator set-point i.e. the target voltage of the regulator when the load current is zero.

The controller 106 also includes a first ADC 110 for sampling the load voltage (Vo) and a second ADC 112 for sampling the sensed low-side transistor current (Isense) of the power stage output phase 104. The low-side transistor current ($I_{LS}$) is sensed by a sense circuit 114 included in the switching regulator. The controller 106 further includes an adaptive voltage positing (AVP) unit 118 that generates an offset (Vavp) to the reference voltage (Vref) by an amount proportional to a cycle average current estimate (Iph_est) generated by a phase current estimator 120 of the switching regulator. By doing so the cycle average current estimate is incorporated into the response of the switching regulator. The cycle average current estimate is generated based on the measured low-side transistor current in the previous PWM cycle and a prediction of the pulse width of the present PWM cycle.

The offset (Vavp) generated by the AVP unit 118 constitutes an error signal (e) which is input to a compensator 122 of the controller 100. In one embodiment, the compensator 122 is a PID (proportional-integral-derivative) filter which implements a compensator transfer function with the error voltage (e) as an input and duty cycle as the output. As such, the duty cycle of the PWM signal provided to the power stage 100 of the switching regulator is based on the offset (Vavp) generated by the AVP unit 118.

Figure 2:
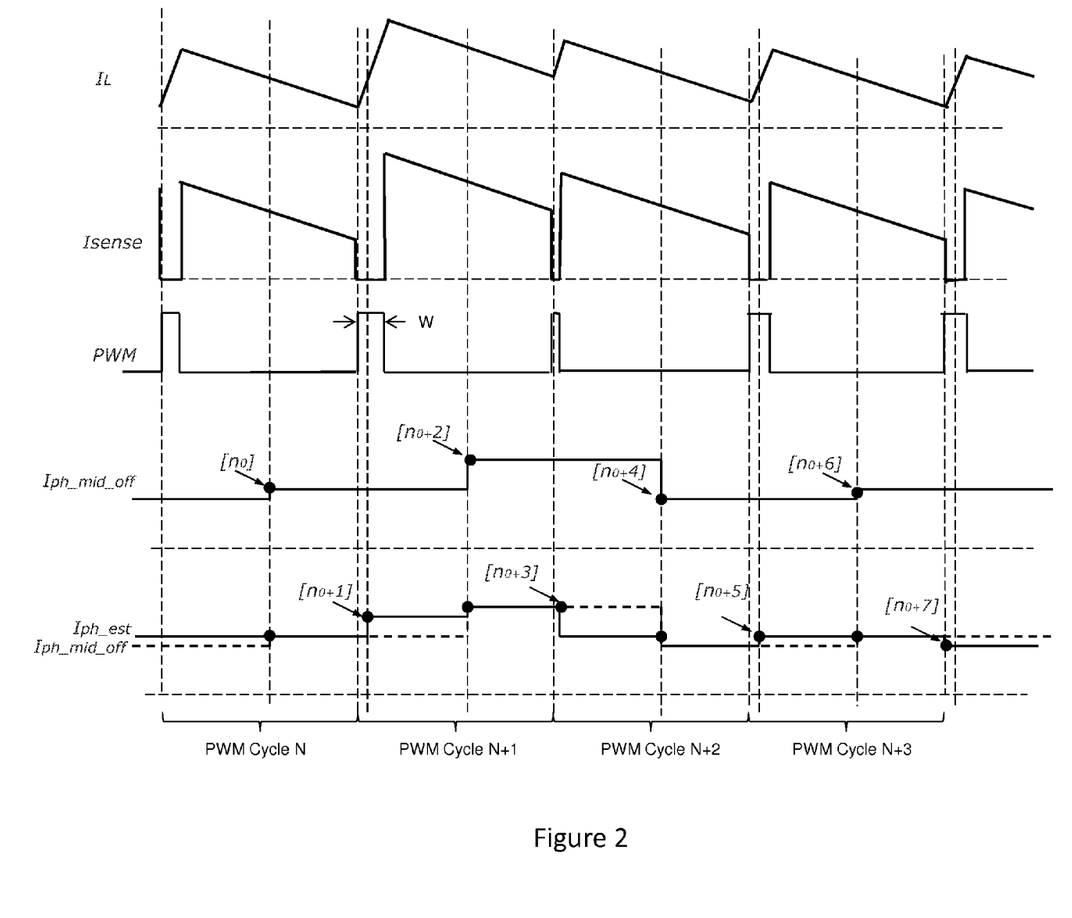
FIG. 2 illustrates a plot diagram of various signals during the cycle-by-cycle current estimation process.

Operation of the switching regulator with regard to the cycle-by-cycle phase current estimation is described next in more detail with reference to FIG. 2. FIG. 2 shows the inductor current ($I_L$), the sensed low-side transistor current (Isense), the sampled low-side transistor current (Iph_mid_off) and the cycle average current estimate (Iph_est) generated by the phase current estimator 120 plotted as a function of the PWM signal applied to the power stage 100. Each on-portion of the PWM signal has a certain width (W) which is estimated in the present PWM cycle and used in the cycle-by-cycle phase current estimation as described in more detail below.

The second ADC 112 samples the sensed low-side transistor current (Isense) during the off-portion for each PWM cycle e.g. at the midpoint. The phase current estimator 120 estimates the cycle average current (Iph_est) for the present PWM cycle based on the low-side transistor current sampled during the off-portion for the immediately preceding PWM cycle and a pulse width estimate for the on-portion for the present PWM cycle.

FIG. 2 shows four consecutive PWM cycles (N, N+1, N+2 and N+3), each cycle having an on-portion (with a width W) shorter than the off-portion. The cycle average current (Iph_est) for PWM cycle N+1 is estimated based on the low-side transistor current sampled at the midpoint of the off-portion for PWM cycle N (represented by the sample of Iph_mid_off taken at point [n0] in FIG. 2) and the pulse width estimate generated at the midpoint of the on-portion for PWM cycle N+1 (represented by point [n0+1] in FIG. 2).

In one embodiment, the phase current estimator 120 utilizes information on the input voltage (Vin), output phase inductor value (L), average duty cycle (Davg) over several PWM cycles, and the duty cycle (d) of the present PWM cycle to estimate the cycle average current (Iph_est) as given by:

$$I_{ph\_est}[n_0 + k] = \begin{cases} I_{ph\_mid\_off}[n_0 + k] & k = 2M \\ I_{ph\_mid\_off}[n_0 + k - 1] + & k = 2M + 1 \\ \frac{V_{in} \times T_{SW}}{2L}(d_{half}[n_0 + k] - D_{avg}) & \end{cases} \quad (1)$$

where Tsw is the switching frequency of the output phase and n0 is an integer indicating past samples. The average duty cycle (Davg) can be calculated by averaging the last T duty cycles of the PWM signal.

The expression $I_{ph\_mid\_off}[n_0+k-1]$ in equation (1) represents the low-side transistor current ($I_{LS}$) sampled at the midpoint of the off-portion for the immediately preceding PWM cycle (k=2M), and the expression $$\frac{V_{in} \times T_{SW}}{2L}(d_{half}[n_0 + k] - D_{avg})$$

represents an estimate of the high-side transistor current of the output phase at the midpoint of the on-portion for the present PWM cycle (k=2M+1). The expression $$\frac{V_{in} \times T_{SW}}{2L}(d_{half}[n_0 + k] - D_{avg})$$

is not based on an actual sample, but rather is a function of the input voltage (Vin) applied to the output phase, the phase switching frequency (Tsw), the phase output inductance (L), and the difference between the duty cycle calculated at the midpoint of the on-portion for the present PWM cycle ($d_{half}[n_0+k]$) and the average duty cycle (Davg) for M previously completed PWM cycles, where $$\frac{V_{in} \times T_{SW}}{2L}$$

represents the pulse width estimate at the midpoint of the on-portion for current PWM cycle. The phase current estimator 120 combines $$I_{ph\_mid\_off}[n_0 + k - 1] \text{ and } \frac{V_{in} \times T_{SW}}{2L}(d_{half}[n_0 + k] - D_{avg})$$

to generate the cycle average current estimate (Iph_est) for the present PWM cycle.

Figure 3:
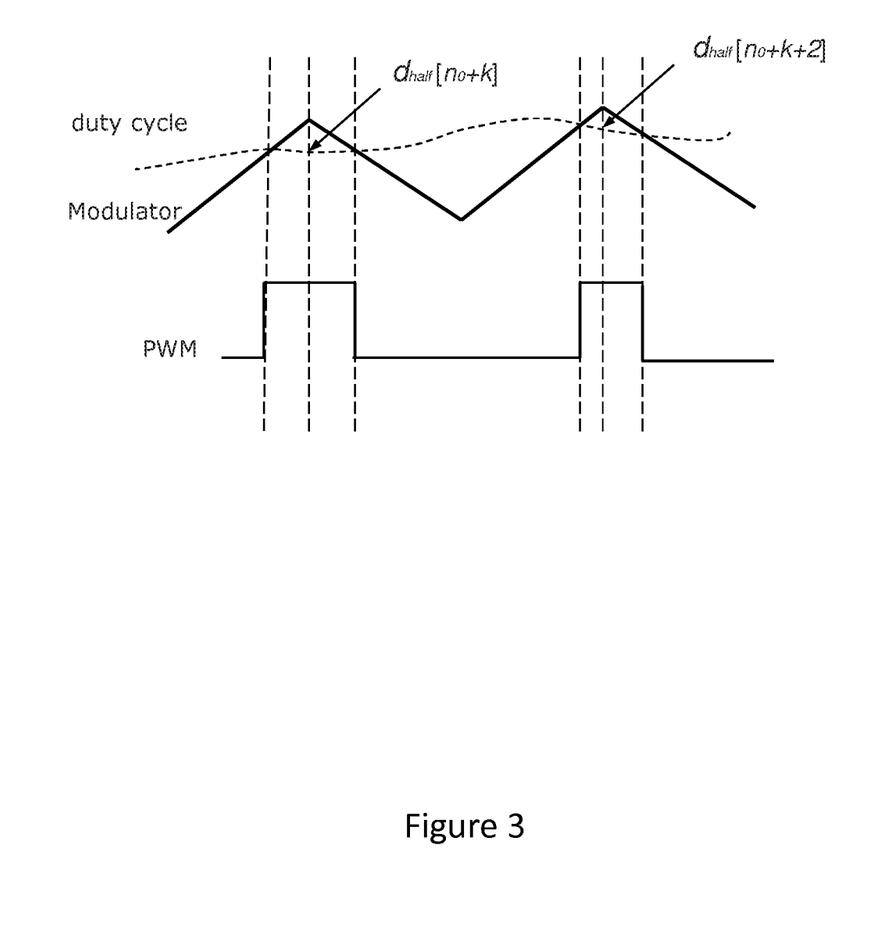
FIG. 3 illustrates a plot diagram of an embodiment of estimating pulse width at the mid-point of the on-portion of a PWM cycle.

FIG. 3 shows an embodiment of deriving the duty cycle ($d_{half}[n_0+k]$) during the on-portion for the PWM cycles. FIG. 3 shows the PWM signal applied to the power stage 100 and a triangle modulator signal from which the PWM signal is derived. FIG. 3 also shows the average duty cycle as a dashed line. The duty cycle is determined before the next PWM cycle begins, and therefore is known during the on-portion of each PWM cycle as indicated in FIG. 3. The value of the duty cycle e.g. at the midpoint of the on-portion of the PWM cycle is used in conjunction with the phase input voltage (Vin), phase inductor value (L) and average duty cycle (Davg) to estimate the high-side transistor current of the output phase 104 e.g. at the midpoint of the on-portion for the present PWM cycle in accordance with equation (1).

The latency of the current samples can be reduced by up to half even though a single sample/cycle ADC 112 is employed, by using current estimates in the middle of two consecutive PWM cycles. Once the present PWM cycle is completed, the phase current estimator 120 can compare the cycle average current estimate (Iph_est) with the actual phase current measurement upon completion of the PWM cycle to generate a prediction error. The phase current estimator 120 can then compensate for the prediction error so that the steady-state response of the switching regulator is unaffected by the prediction error and does not introduce a static error.

Figure 4:
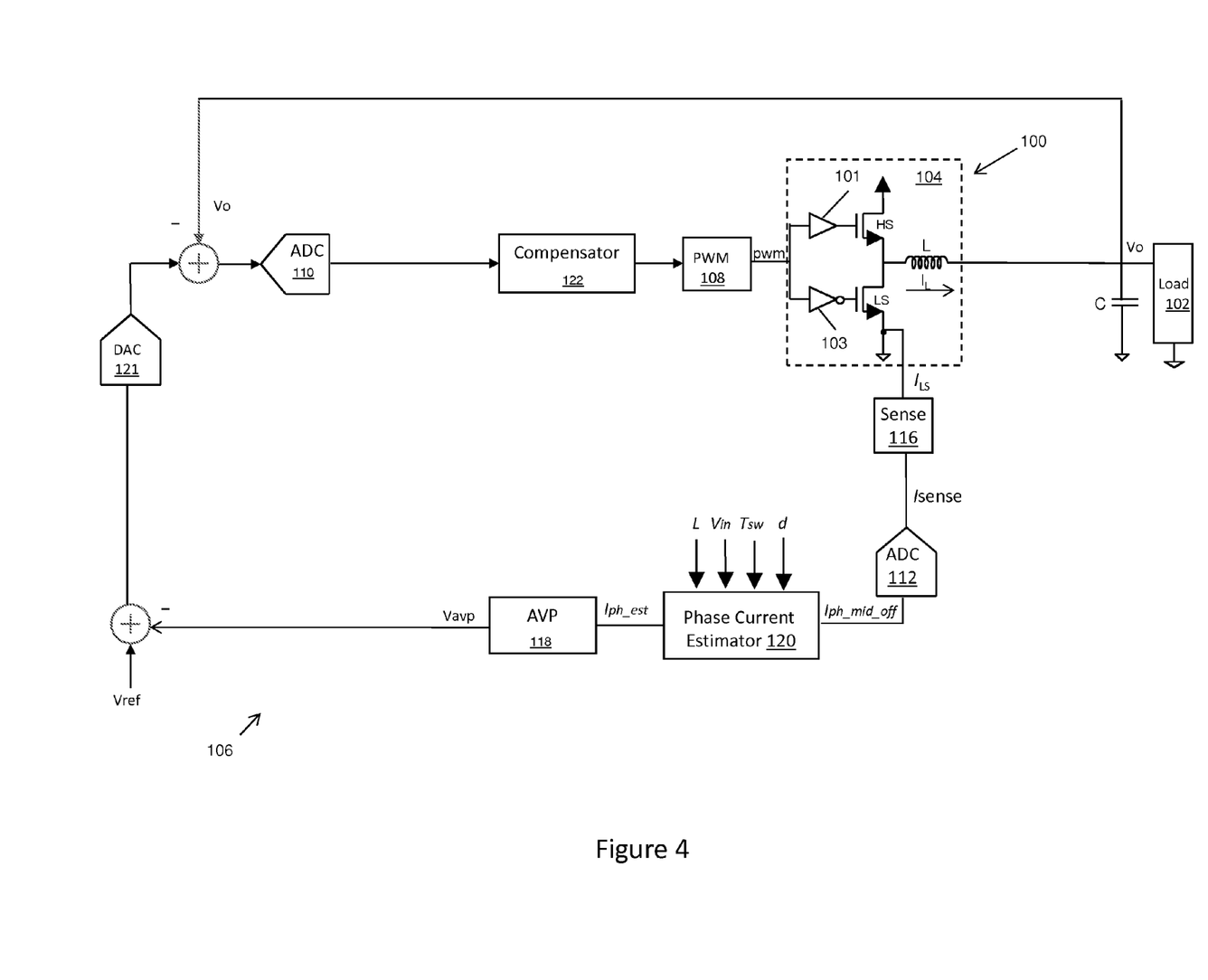
FIG. 4 illustrates a block diagram of an embodiment of a multi-phase switching regulator which implements cycle-by-cycle current estimation.

FIG. 4 illustrates a block diagram of an embodiment of a switched mode buck converter which is similar to the embodiment shown in FIG. 1, however the offset voltage (Vavp) generated by the AVP 116 is incorporated into the voltage feedback loop before the output voltage (Vo). According to this embodiment, Vavp is combined with Vref and the difference voltage converted to the analog domain by a DAC (digital-to-analog converter) 121. The resulting analog difference voltage is then combined with Vo and reconverted to the digital domain for further processing as previously described herein. In contrast, Vavp is introduced into the voltage feedback loop after Vref is combined with Vo according to the embodiment illustrated in FIG. 1.

In each case, a low duty cycle buck converter can be used where the cycle average current is determined during the off cycle. For example, the output current can be measured at the midpoint of the off cycle. The cycle average current change is strongly affected by the duration of the on cycle. Current estimation allows the cycle average to be estimated based on the duration of the on cycle and the cycle average of the previous cycle with low latency. The on time can be estimated by examining the PWM control signal during the on cycle, or alternatively by examining the beginning or midpoint of the on cycle.

Figure 5:
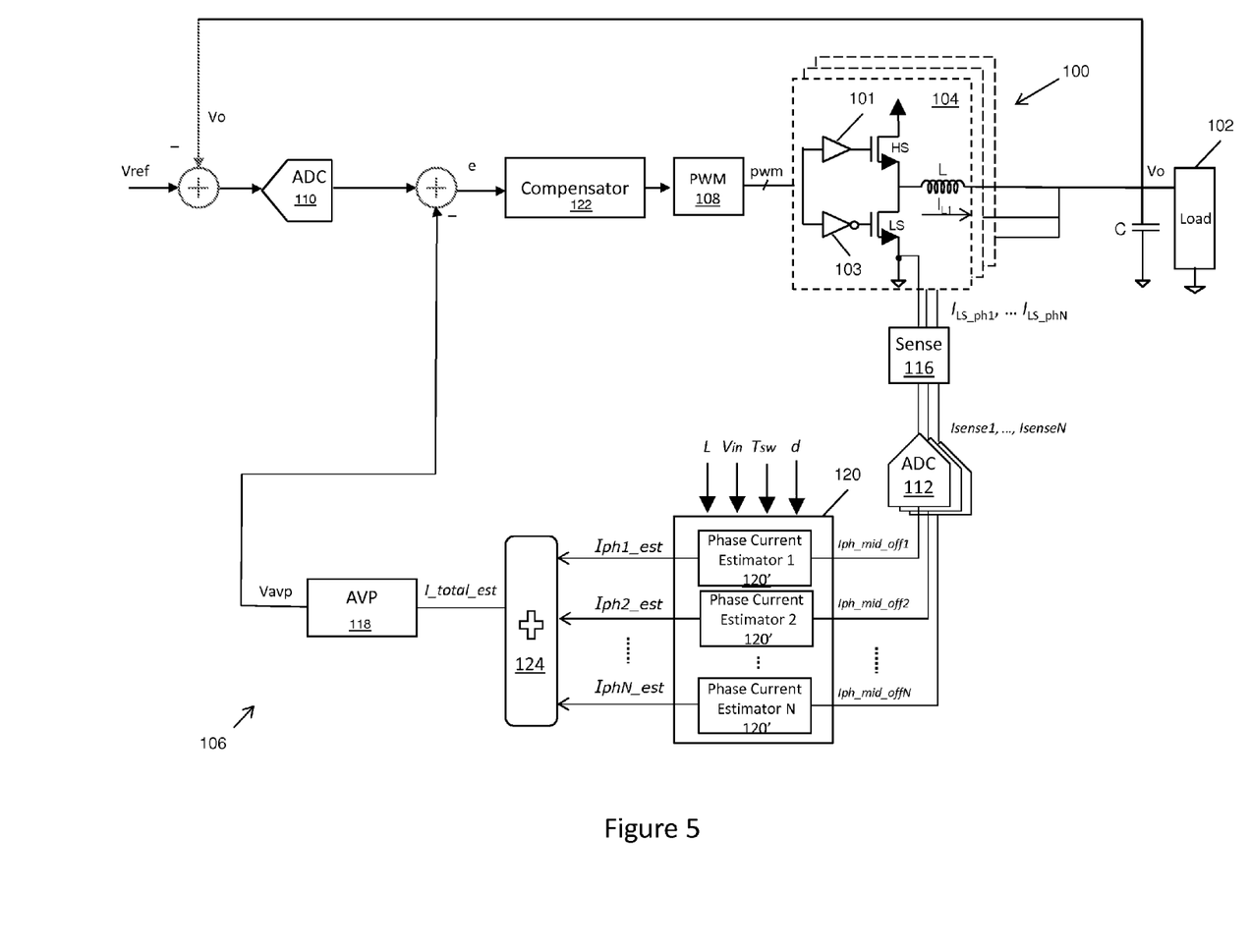
FIG. 5 illustrates a block diagram of an embodiment of a multi-phase switched mode buck converter.

FIG. 5 illustrates a block diagram of an embodiment of a switched mode buck converter which is similar to the embodiment shown in FIG. 1, however the power stage 100 has N phases 104 i.e. the switched mode buck converter is a multi-phase switching regulator where the load current can be supplied by one or more phases 104 depending on the load conditions. According to this embodiment, the current sense circuit 116 senses the current ($I_{LS\_ph1}, \ldots, I_{LS\_phN}$) of each low-side transistor and a single sample/cycle DAC 112 is provided for each phase 104 to sample the sensed low-side transistor current ($I_{sense1}, \ldots, I_{senseN}$) of each phase 104 during the off-portion for each PWM cycle as previously described herein.

The current estimator 120 of the multi-phase switching regulator includes a phase current estimator 120' for each phase 104 of the power stage 100, for estimating the average current ($I_{ph1\_est}, \ldots, I_{phN\_est}$) of each phase 104 for the present PWM cycle. The average current of each output phase is estimated for the present PWM cycle based on the low-side transistor current measured for each output phase e.g. at the midpoint of the off-portion for the immediately preceding PWM cycle ($I_{ph\_mid\_off1}, \ldots, I_{ph\_mid\_offN}$) and the pulse width estimate e.g. at the midpoint of the on-portion for the present PWM cycle in accordance with equation (1). That is, the low-side transistor current measured for each phase 104 at the midpoint of the immediately preceding PWM cycle ($I_{ph\_mid\_offn}[n_0+k-1]$) is combined with the high-side transistor current estimated for the same phase 104 at the midpoint of the on-portion for the present PWM cycle $$\left( \frac{V_{in} \times T_{SW}}{2L} (d_{half}[n_0 + k] - D_{avg}) \right)$$

to generate a per-phase average current estimate (I_ph1_est, . . . , IphN_est) for the present PWM cycle.

The multi-phase switching regulator further includes a combiner 124 for combining the N current estimates ($I_{ph1\_est}$, . . . , $I_{phN\_est}$) to generate a total average current estimate (I_total_est) for the present PWM cycle. The total average current estimate is provided to the AVP unit 118 during each PWM cycle so that the AVP unit 118 can generate a corresponding proportional offset (Vavp) to the reference voltage (Vref) each PWM cycle.

The AVP unit 118 samples the output voltage (Vo) of the multi-phase switching regulator at a higher frequency than the low-side transistor current is sampled for the N output phases 104. The AVP unit 118 converts the sampled output voltage to a current-based representation of the sampled output voltage. In one embodiment, the current combiner 124 is part of the AVP unit 118 and the AVP unit 118 combines the current-based representation of the sampled output voltage and the average current estimates (I_ph1_est, . . . , IphN_est) for the N output phases 104 to generate the total average current estimate (I_total_est) for the present PWM cycle.

The current estimator 120 can compare the total average current estimate for each PWM cycle to a total measured phase current for the same PWM cycle upon completion of that PWM cycle to generate a prediction error, and compensate for the prediction error so that the steady-state response of the multi-phase switching regulator is unaffected by the prediction error as previously described herein.

Figure 6:
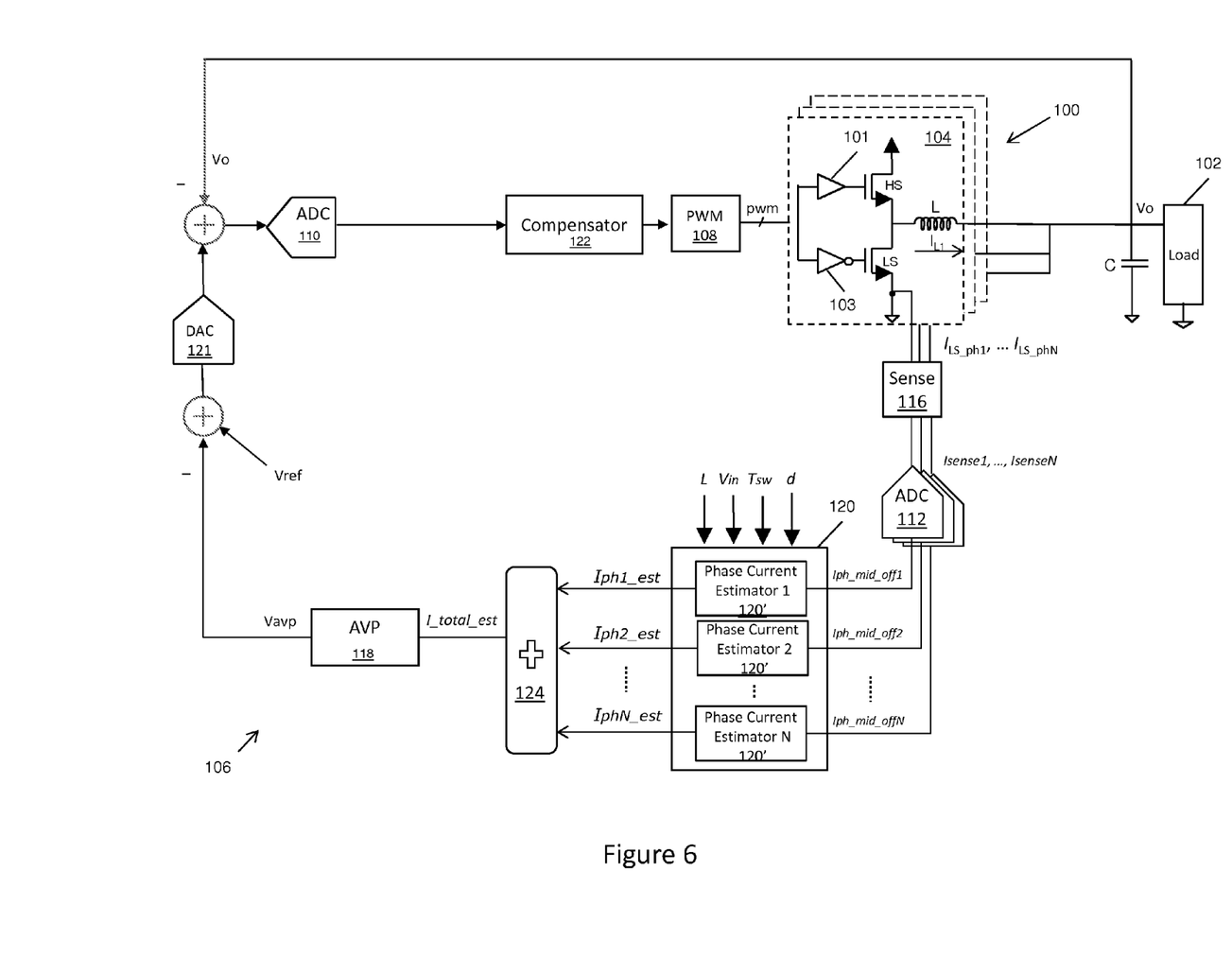
FIG. 6 illustrates a block diagram of another embodiment of a multi-phase switched mode buck converter.

FIG. 6 illustrates a block diagram of an embodiment of a switched mode buck converter which is similar to the embodiment shown in FIG. 5, however the offset voltage (Vavp) generated by the AVP 116 is incorporated into the voltage feedback loop before the output voltage (Vo) as previously described herein with reference to FIG. 4. The analog difference voltage between Vavp and Vref is combined with Vo and reconverted to the digital domain for further processing as previously described herein.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of estimating cycle average current for an output phase of a switching regulator during pulse width modulation (PWM) cycles of the switching regulator, each PWM cycle having an on-portion and an off-portion, the method comprising:
   measuring a low-side transistor current of the output phase during the off-portion for each PWM cycle;
   estimating a pulse width for the on-portion for the present PWM cycle;
   estimating a cycle average current for the present PWM cycle based on the low-side transistor current measured during the off-portion for the immediately preceding PWM cycle and the pulse width estimate for the on-portion for the present PWM cycle;
   comparing the cycle average current estimated for each PWM cycle to a measured phase current for the same PWM cycle upon completion of that PWM cycle to generate a prediction error;
   incorporating the cycle average current estimate into a response of the switching regulator; and
   compensating for the prediction error so that a steady-state response of the switching regulator is unaffected by the prediction error.

2. The method according to claim 1, wherein measuring the low-side transistor current during the off-portion for each PWM cycle comprises:
   sensing the low-side transistor current; and
   sampling the sensed low-side transistor current at a midpoint of the off-portion for each PWM cycle.

3. The method according to claim 1, wherein estimating the cycle average current for the present PWM cycle based on the low-side transistor current measured during the off-portion for the immediately preceding PWM cycle and the pulse width estimate for the present PWM cycle comprises:
   estimating a high-side transistor current of the output phase at a midpoint of the on-portion for the present PWM cycle as a function of an input voltage applied to the output phase, a switching frequency of the output phase, an output inductance of the output phase, and a difference between a duty cycle for the present PWM cycle and an average duty cycle for a number of completed PWM cycles; and
   combining the low-side transistor current measured at the midpoint of the immediately preceding PWM cycle and the high-side transistor current estimated at the midpoint of the on-portion for the present PWM cycle.

4. A switching regulator, comprising:
   an output phase including a high-side transistor and a low-side transistor operable to switch on and off at different periods responsive to a pulse width modulation (PWM) signal applied to the output phase, each cycle of the PWM signal having an on-portion and an off-portion;
   a current sense circuit operable to sense the current of the low-side transistor;
   an analog-to-digital converter operable to sample the sensed low-side transistor current during the off-portion for each PWM cycle; and
   a current estimator operable to estimate a cycle average current for the present PWM cycle based on the low-side transistor current sampled during the off-portion for the immediately preceding PWM cycle and a pulse width estimate for the on-portion for the present PWM cycle, determine a prediction error by comparing the cycle average current estimated for each PWM cycle to a measured phase current for the same PWM cycle upon completion of that PWM cycle, and compensate for the prediction error so that a steady-state response of the switching regulator is unaffected by the prediction error.

5. The switching regulator according to claim 4, wherein the current estimator is operable to:
   estimate a high-side transistor current of the output phase at a midpoint of the on-portion for the present PWM cycle as a function of an input voltage applied to the output phase, a switching frequency of the output phase, an output inductance of the output phase, and a difference between a duty cycle for the present PWM cycle and an average duty cycle for a number of completed PWM cycles; and
   combine the low-side transistor current measured at the midpoint of the immediately preceding PWM cycle and the high-side transistor current estimated at the midpoint of the on-portion for the present PWM cycle.

6. The switching regulator according to claim 4, wherein the switching regulator is a switched mode buck converter.

7. A method of estimating cycle average current for a plurality of output phases of a multi-phase switching regulator during pulse width modulation (PWM) cycles of the multi-phase switching regulator, each PWM cycle having an on-portion and an off-portion, the method comprising:
   measuring a low-side transistor current of each output phase during the off-portion for each PWM cycle;
   estimating a pulse width for the on-portion for the present PWM cycle;
   estimating an average current of each output phase for the present PWM cycle based on the low-side transistor current measured for each output phase during the off-portion for the immediately preceding PWM cycle and the pulse width estimate for the on-portion for the present PWM cycle;
   combining the average current estimates for the plurality of output phases to generate a total average current estimate for the present PWM cycle;
   comparing the total average current estimated for each PWM cycle to a measured current for the same PWM cycle upon completion of that PWM cycle to generate a prediction error; and
   compensating for the prediction error so that a steady-state response of the multi-phase switching regulator is unaffected by the prediction error.

8. The method according to claim 7, wherein measuring the low-side transistor current of each output phase during the off-portion for each PWM cycle comprises:
   sensing the low-side transistor current of each output phase; and
   sampling the sensed low-side transistor current of each output phase at a midpoint of the off-portion for each PWM cycle.

9. The method according to claim 7, wherein estimating the average current of each output phase for the present PWM cycle based on the low-side transistor current measured for each output phase during the off-portion for the immediately preceding PWM cycle and the pulse width estimate for the present PWM cycle comprises estimating a high-side transistor current of each output phase at a midpoint of the on-portion for the present PWM cycle as a function of an input voltage applied to each output phase, a switching frequency of each output phase, an output inductance of each output phase, and a difference between a duty cycle for the present PWM cycle and an average duty cycle for a number of completed PWM cycles.

10. The method according to claim 7, wherein combining the average current estimates for the plurality of output phases to generate the total average current estimate for the present PWM cycle comprises combining the low-side transistor current measured for each output phase at the midpoint of the immediately preceding PWM cycle and the high-side transistor current estimated for the same output phase at the midpoint of the on-portion for the present PWM cycle.

11. The method according to claim 7, further comprising:
   sampling an output voltage of the switching regulator at a higher frequency than the low-side transistor current for the plurality of output stages;
   converting the sampled output voltage to a current-based representation of the sampled output voltage; and
   combining the current-based representation of the sampled output voltage and the average current estimates for the plurality of output phases to generate the total average current estimate for the present PWM cycle.

12. A multi-phase switching regulator, comprising:
   a plurality of output phases each including a high-side transistor and a low-side transistor operable to switch on and off at different periods responsive to a pulse width modulation (PWM) signal, each cycle of the PWM signal having an on-portion and an off-portion;
   a current sense circuit operable to sense the current of each low-side transistor;
   an analog-to-digital converter operable to sample the sensed low-side transistor current of each output phase during the off-portion for each PWM cycle; and
   a current estimator operable to estimate an average current of each output phase for the present PWM cycle based on the low-side transistor current measured for each output phase during the off-portion for the immediately preceding PWM cycle and a pulse width estimate for the on-portion for the present PWM cycle, combine the average current estimates for the plurality of output phases to generate a total average current estimate for the present PWM cycle, determine a prediction error by comparing the average current estimated for each PWM cycle to a measured current for the same PWM cycle upon completion of that PWM cycle, and compensate for the prediction error so that a steady-state response of the multi-phase switching regulator is unaffected by the prediction error.

13. The multi-phase switching regulator according to claim 12, wherein the current estimator is operable to:
   estimate a high-side transistor current of each output phase at a midpoint of the on-portion for the present PWM cycle as a function of an input voltage applied to each output phase, a switching frequency of each output phase, an output inductance of each output phase, and a difference between a duty cycle for the present PWM cycle and an average duty cycle for a number of completed PWM cycles; and
   combine the low-side transistor current measured for each output phase at the midpoint of the immediately preceding PWM cycle and the high-side transistor current estimated for the same output phase at the midpoint of the on-portion for the present PWM cycle to generate the total average current estimate for the present PWM cycle.

14. The multi-phase switching regulator according to claim 12, further comprising an adaptive voltage positioning unit operable to:
   sample an output voltage of the switching regulator at a higher frequency than the low-side transistor current for the plurality of output stages;
   convert the sampled output voltage to a current-based representation of the sampled output voltage; and
   combine the current-based representation of the sampled output voltage and the average current estimates for the plurality of output phases to generate the total average current estimate for all of the output phases for the present PWM cycle.

15. The multi-phase switching regulator according to claim 12, wherein the multi-phase switching regulator is a multi-phase switched mode buck converter.

* * * * *